United States Patent [19]
Davies et al.

[11] Patent Number: 5,661,048
[45] Date of Patent: Aug. 26, 1997

[54] METHOD OF MAKING AN INSULATED GATE SEMICONDUCTOR DEVICE

[75] Inventors: Robert B. Davies, Tempe; Chandrasekhara Sudhama, Scottsdale, both of Ariz.; Frank K. Baker, Austin, Tex.

[73] Assignee: Motorola, Inc., Schaumburg, Ill.

[21] Appl. No.: 408,654

[22] Filed: Mar. 21, 1995

[51] Int. Cl.$^6$ .................................. H01L 21/265
[52] U.S. Cl. .................. 438/217; 438/230; 438/286; 438/303; 438/592; 438/595
[58] Field of Search .................. 437/40 AS, 41 AS, 437/44, 34, 57

[56] References Cited

U.S. PATENT DOCUMENTS

| | | | |
|---|---|---|---|
| 4,319,395 | 3/1982 | Lund et al. | 437/41 GS |
| 4,619,038 | 10/1986 | Pintchovski . | |
| 4,949,136 | 8/1990 | Jain . | |
| 4,968,639 | 11/1990 | Bergonzoni . | |
| 5,019,879 | 5/1991 | Chiu | 437/44 |
| 5,170,232 | 12/1992 | Narita . | |
| 5,196,357 | 3/1993 | Boardman et al. | 437/40 GS |
| 5,270,232 | 12/1993 | Kimura et al. | 437/40 GS |
| 5,286,664 | 2/1994 | Horiuchi | 437/40 AS |
| 5,342,798 | 8/1994 | Huang | 437/41 AS |
| 5,372,960 | 12/1994 | Davies et al. . | |
| 5,427,971 | 6/1995 | Lee et al. | 437/41 GS |
| 5,482,878 | 1/1996 | Burger et al. | 437/41 AS |

FOREIGN PATENT DOCUMENTS

| | | | |
|---|---|---|---|
| 0387722 | 9/1990 | European Pat. Off. . | |
| 0140818 | 3/1980 | Germany | 437/41 GS |
| 56-33881 | 4/1981 | Japan . | |
| 56-62367 | 5/1981 | Japan | 437/44 |
| 63-44769 | 2/1988 | Japan . | |
| 1189964 | 7/1989 | Japan | 437/44 |
| 1212474 | 8/1989 | Japan | 437/40 SH |
| 0412534 | 1/1992 | Japan | 437/44 |
| 4154171 | 5/1992 | Japan . | |
| 4199517 | 7/1992 | Japan | 437/40 AS |

*Primary Examiner*—Charles L. Bowers, Jr.
*Assistant Examiner*—Lynne A. Gurley
*Attorney, Agent, or Firm*—Rennie William Dover

[57] ABSTRACT

An insulated gate field effect transistor (10) having a reduced gate to drain capacitance and a method of manufacturing the field effect transistor (10). A dopant well (13) is formed in a semiconductor substrate (11) and a drain extension region (25) is formed in the dopant well (13). An oxide layer (26) is formed on the dopant well (13) wherein the oxide layer (26) has a thickness of at least 400 angstroms. A gate structure (61) having a gate shunt portion (32) over a thinned portion of the oxide (26) and a gate extension portion (58) over an unthinned portion of the oxide (26). The thinned portion of the oxide (26) forms a gate oxide of the field effect transistor (10) and the unthinned portion lowers a capacitance of the gate shunt portion (32) of the field effect transistor (10).

23 Claims, 19 Drawing Sheets

METHOD OF MAKING AN INSULATED GATE SEMICONDUCTOR DEVICE

BACKGROUND OF THE INVENTION

The present invention relates, in general, to insulated gate semiconductor devices, and more particularly, to controlling a threshold voltage, $V_T$, and increasing a transconductance, $g_m$, of insulated gate semiconductor devices.

BACKGROUND OF THE INVENTION

As those skilled in the art are aware, $V_T$ is related to the voltage at which an insulated gate semiconductor device turns on and varies in accordance with the carrier concentration of the channel region. For example, the gate-source voltage ($V_{GS}$) of an N-channel insulated gate semiconductor device must exceed $V_T$ to form a channel in the insulated gate semiconductor device. Since the voltage at the gate is typically the input voltage of the insulated gate semiconductor device, the input voltage relative to the source voltage must exceed $V_T$ for a conducting channel to be formed. In other words, a significant drain current ($I_D$) will not flow through a channel region of the insulated gate semiconductor device unless $V_{GS}$ is greater than $V_T$. In addition, $V_T$ is important in determining the saturation current of an insulated gate semiconductor device, which in turn helps determine the power bandwidth of the device.

Although precise control of $V_T$ is highly desirable in all insulated gate semiconductor device applications, it is particularly important in low voltage applications. For insulated gate semiconductor devices using standard power supply levels, the difference between the upper power supply rail (5 volts) and the lower power supply rail (0 volts) is sufficiently large, i.e., approximately 5 volts, that fluctuations in $V_T$ have a negligible effect on the device performance. However, in low voltage applications when the difference between the power supply rails is less than 1.5 volts, $V_T$ represents a substantial portion of the total power supply voltage. Consequently, fluctuations in $V_T$ result in large fluctuations in the current drive capability of the insulated gate semiconductor device.

In addition, the transconductance, $g_m$, of the insulated gate field effect transistors is influenced by their $V_{GS}$, $I_D$, and $V_T$. Since the transconductance increases as $I_D$ increases, it is desirable to maximize $I_D$, thereby increasing the transconductance. Further, a high frequency switching speed of the insulated gate field effect transistors is reduced by the combination of the gate to drain capacitance and the gate to source capacitance, collectively referred to as gate capacitances. Thus, a large gate capacitance decreases the bandwidth or lowers the frequency response of the insulated gate field effect transistor.

Accordingly, it would be advantageous to have an insulated gate field effect transistor and method of manufacturing the insulated gate field effect transistor that provides control of the threshold voltage and minimization of the gate capacitance in low voltage, high bandwidth applications.

DETAILED DESCRIPTION OF THE DRAWINGS

Figure 1:
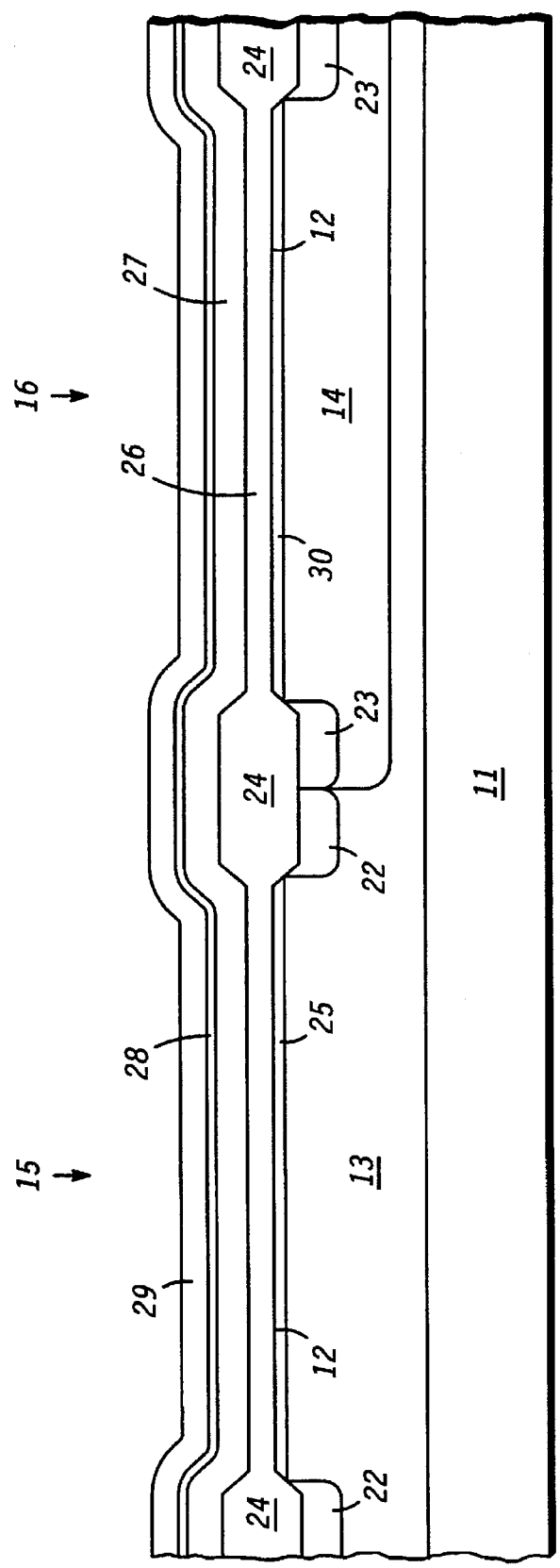
FIGS. 1–9 illustrate highly enlarged cross-sectional views of a portion of insulated gate field effect transistors during processing in accordance with a first embodiment of the present invention.

Generally, the present invention provides an insulated gate semiconductor device and a method of fabricating or forming the insulated gate semiconductor device. Insulated gate semiconductor devices are also referred to as insulated gate field effect devices and insulated gate field effect transistors. The insulated gate semiconductor devices manufactured in accordance with the present invention have a reduced gate capacitance, thus a higher frequency response or bandwidth, compared to insulated gate semiconductor devices manufactured by other methods. More particularly, the insulated gate semiconductor devices of the present invention have a lightly doped drain (LDD) extension at a drain region of the device which permits formation of a thicker gate dielectric material between the portion of the gate structure adjacent the drain region and the lightly doped drain extension region. Thus, the gate structure comprises two conductive portions: a conductive portion near the drain region of the device which serves as a shunt electrode and an extension, i.e., a second conductive portion, adjacent the source region of the device which serves as an active gate structure.

It shall be understood that the same reference numerals are used in the figures to denote the same elements. It shall be further understood that the materials, concentrations, and thicknesses provided in the description of the present invention merely serve as examples and are not limitations of the present invention.

FIG. 1 illustrates an enlarged cross-sectional view of a portion of partially completed complementary insulated gate field effect transistors 10 during processing in accordance with a first embodiment of the present invention. Complementary insulated gate field effect transistors 10 include an N-channel transistor 15 fabricated in a portion of a P-type epitaxial layer 13 and a P-channel transistor 16 fabricated in a portion of an N-well 14. What is shown in FIG. 1 is a substrate 11 of P conductivity type having an epitaxial layer 13 disposed thereon. By way of example, epitaxial layer 13 is of P conductivity type, has a major surface 12, and ranges in thickness between approximately 2 microns (μm) and 5 μm. Using methods known in the art, an impurity well 14 of N conductivity type is formed in a portion of P-type epitaxial layer 13. Substrate 11 has, for example, a resistivity ranging from approximately 0.01 ohm-centimeter (Ω-cm) to approximately 0.1 Ω-cm, and P-type epitaxial layer 13 has a resistivity between approximately 6 Ω-cm and approximately 8 Ω-cm. P-type epitaxial layer 13 and N-well 14 have a surface concentration on the order of $5 \times 10^{15}$ atoms per cubic centimeter (atoms/cm$^3$). Although the description of the present invention includes the combination of substrate 11 and P-type epitaxial layer 13 to prevent latch-up, it should be understood that insulated gate field effect transistors of the present invention may be manufactured in a semiconductor material such as substrate 11. In addition, field implant regions 22 are formed in P-type epitaxial layer 13, field implant regions 23 are formed in N-well 14, and field oxide regions 24 are formed over field implant regions 22 and 23. Formation of epitaxial layers, dopant wells, field implant regions, and field oxide regions are well known to those skilled in the art.

An implant block mask (not shown) such as, for example, photoresist, is formed over N-well 14 and an impurity material of N conductivity type is implanted into a portion of P-type epitaxial layer 13 to form a dopant layer 25 between two adjacent field oxide regions 24. Although dopant layer 25 is shown as extending across an entire portion of P-type epitaxial layer 13 between adjacent field oxide regions 24, it should be understood that dopant layer 25 may be formed to extend across a subportion of the P-type epitaxial layer 13 that is between adjacent field oxide regions 24. The implant block mask is removed and an implant block mask is formed on the P-type epitaxial layer 13. An impurity material of P conductivity type is implanted into a portion of N-well 14 to form a dopant layer 30 between two adjacent field oxide regions 24. Similar to dopant layer 25, dopant layer 30 may be formed to extend across a subportion of N-well 14. It should be noted that dopant layers 25 and 30 serve as drain extension regions for field effect transistors manufactured in P-type epitaxial layer 13 and N-well 14, respectively. Further, dopant layers 25 and 30 permit the formation of a portion of the gate oxide layer to be sufficiently thick to reduce the gate capacitance, thereby improving the frequency response of the field effect transistors.

By way of example, layers 25 and 30 have a surface concentration ranging from approximately $7 \times 10^{16}$ atoms/$cm^3$ to approximately $2 \times 10^{17}$ atoms/$cm^3$. A suitable set of implant conditions to obtain the aforementioned surface concentration includes: an implant dose ranging from approximately $1 \times 10^{12}$ atoms per square centimeter (atoms/$cm^2$) to approximately $3 \times 10^{12}$ atoms/$cm^2$ for both layers 25 and 30; an implant energy for forming dopant layer 25 ranging from approximately 50 kilo-electron volts (KeV) to approximately 200 KeV; and an implant energy for forming dopant layer 30 ranging from approximately 25 KeV to approximately 100 KeV.

A layer of dielectric material 26 is formed on major surface 12. Although some oxidation procedures increase the thickness of field oxide regions 24 during the formation of oxide layer 26, to simplify the description of the present invention and because the increase in thickness is small relative to the overall thickness of field oxide regions 24, the increase in the thickness of field oxide region 24 is not shown. A suitable technique for forming oxide layer 26 is thermal oxidation. Preferably, oxide layer 26 has a thickness of at least 400 angstroms. In accordance with the first embodiment of the present invention, oxide layer 26 has a thickness in the range of approximately 600 angstroms to approximately 1,800 angstroms. A typical thickness of oxide layer 26 is approximately 1,200 angstroms. It should be noted that portions of oxide layer 26 serve as portions of a gate oxide for transistors 15 and 16.

A layer of polysilicon 27 is formed on oxide layer 26 using, for example, a chemical vapor deposition technique. A suitable thickness range for polysilicon layer 27 is from approximately 2,500 angstroms to approximately 4,000 angstroms. A typical thickness for polysilicon layer 27 is approximately 3,300 angstroms. A layer of dielectric material 28 is formed on polysilicon layer 27. For example, layer of dielectric material 28 is a layer of oxide formed by the decomposition of tetraethyl orthosilicate (TEOS). Oxide layers formed by the decomposition of tetraethyl orthosilicate are commonly referred to as TEOS layers. By way of example, oxide layer 28 has a thickness ranging from approximately 50 angstroms to approximately 400 angstroms and a nominal thickness of approximately 150 angstroms. A layer of silicon nitride 29 is formed on layer of dielectric material 28 using, for example, a low pressure chemical vapor deposition (LPCVD) technique. A suitable range of thicknesses for silicon nitride layer 29 is between approximately 150 angstroms and approximately 350 angstroms, and nominal thickness for silicon nitride layer 29 is approximately 250 angstroms.

Figure 2:
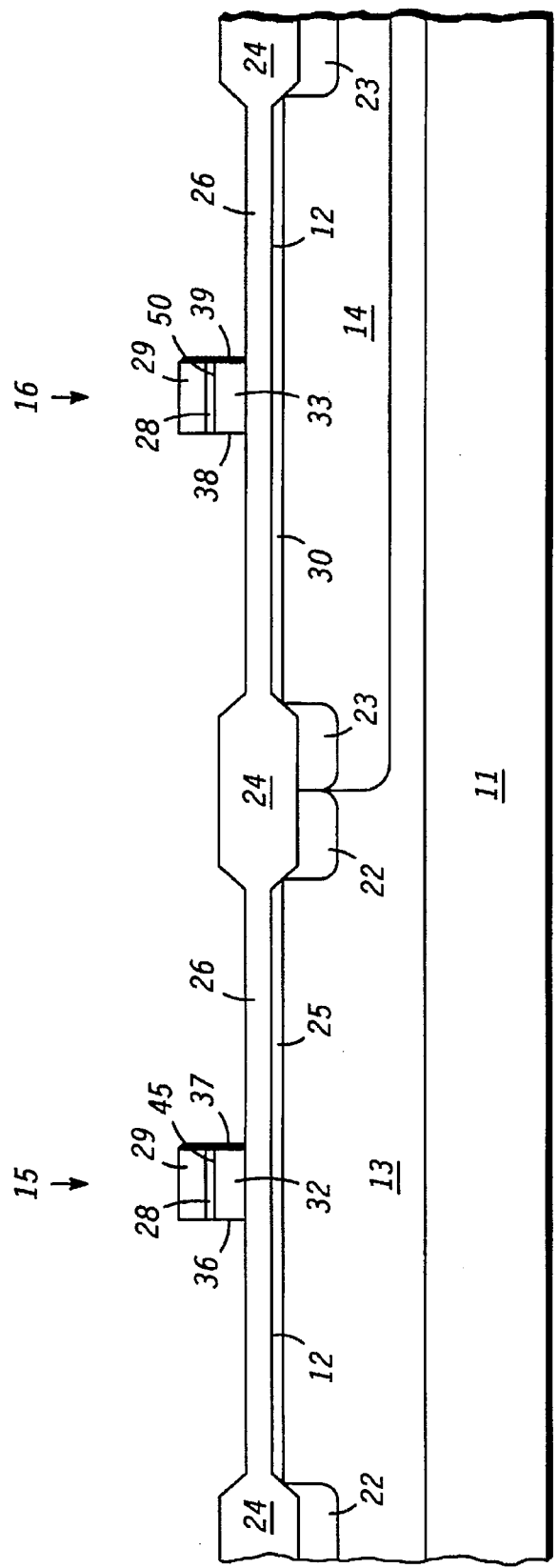

Now referring to FIG. 2, portions 32 and 33 of the gate structures are formed over a portion of P-type epitaxial layer 13 and over a portion of N-well 14. Gate shunt portions 32 and 33 form part of gate structures 61 and 62, respectively, and are shown and further described in FIG. 8. It should be noted that portions 32 and 33 are formed from polysilicon layer 27 and that portion 32 has sides 36 and 37, and a top surface 45, and portion 33 has sides 38 and 39, and a top surface 50. Portions 32 and 33 serve as gate shunt portions of gate structures and are formed by anisotropically etching nitride layer 29, oxide layer 28, and polysilicon layer 27. Gate shunt portions 32 and 33 may be formed, for example, by coating silicon nitride layer 29 with a layer of photoresist (not shown), exposing the portions of silicon nitride layer 29 to be removed (using, for example, photolithographic techniques), and anisotropically etching the exposed portions of silicon nitride layer 29. In addition, the portions of oxide layer 28 and polysilicon layer 27 below the exposed portions of silicon nitride layer 29 are also etched, thereby exposing portions of oxide layer 26 and field oxide regions 24.

Figure 3:
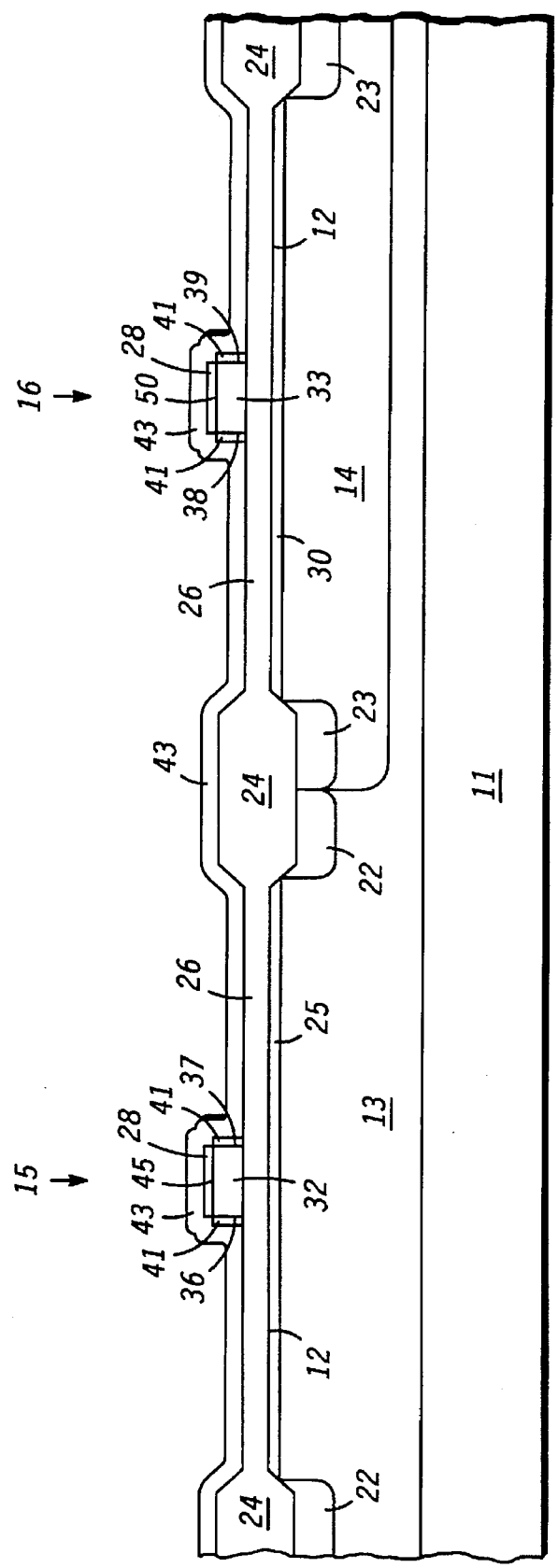

Now referring to FIG. 3, a layer of oxide 41 is formed on exposed sides 36, 37, 38, and 39 of the respective gate shunt portions 32 and 33. By way of example, oxide layer 41 is formed by thermally oxidizing the sides 36, 37, 38, and 39. A suitable thickness range for oxide layer 41 is between approximately 50 angstroms and approximately 250 angstroms, and a nominal thickness of oxide layer 41 is approximately 100 angstroms. Although the formation of oxide layer 41 by thermal oxidization increases the thicknesses of field oxide regions 24 and oxide layer 26, the increased thicknesses of layers 24 and 26 are not shown to simplify the description of the present invention.

A conformal layer of dielectric material 43 is formed on gate shunt portions 32 and 33 as well as on oxide layer 26 and field oxide regions 24. By way of example, layer of dielectric material 43 is silicon nitride having a thickness ranging from approximately 250 angstroms to approximately 750 angstroms, and a nominal thickness of approximately 400 angstroms. It should be noted that the impurity materials of dopant layers 25 and 30 are activated or driven into P-type epitaxial layer 13 and N-well 14, respectively, by the processing steps described supra.

Figure 4:
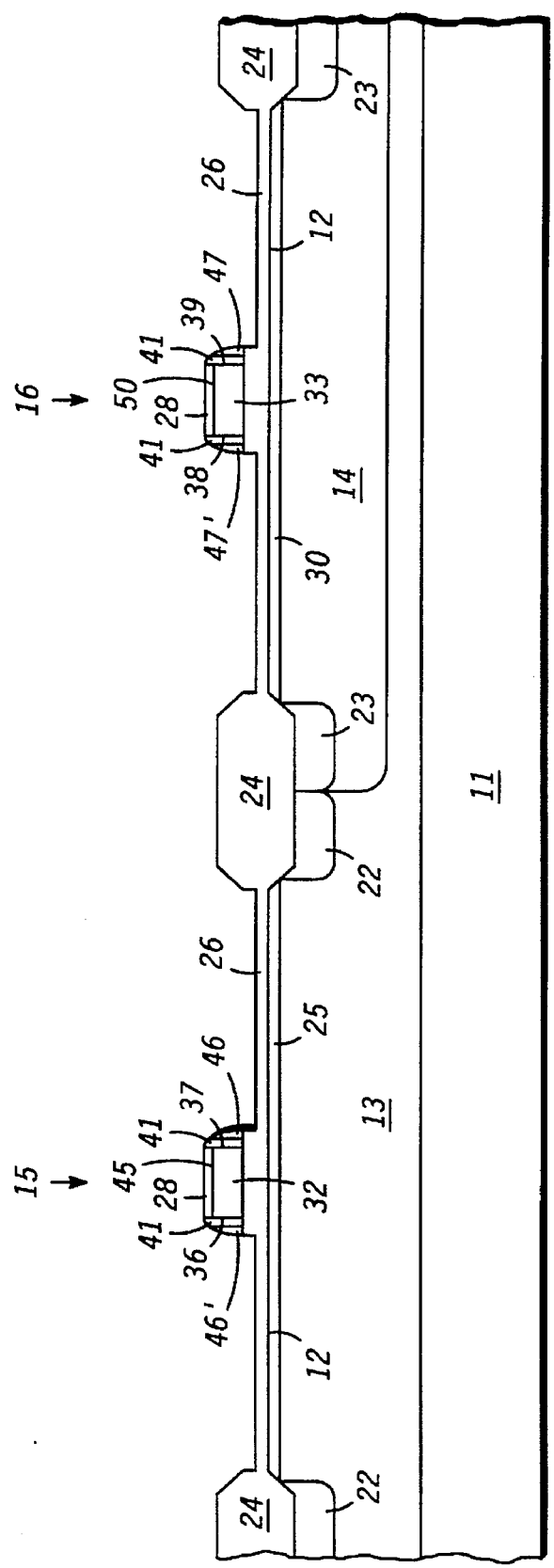

Now referring to FIG. 4, silicon nitride layer 43 is anisotropically etched to form spacers 46, 46', 47, and 47' adjacent oxide layer 41. A suitable technique for etching silicon nitride layer 43 includes a reactive ion etch (RIE) using etchants such as $CF_4$, $NF_3$, and the like. In addition, the anisotropic etch step may remove a portion of oxide layer 26. For example, oxide layer 26 is thinned to approximately 400 angstroms after the formation of spacers 46, 46', 47, and 47'. It should be noted that spacers 46 and 47 protect portions of oxide layer 26 and that spacers 46' and 47' shape oxide layer 26 in order to create a repeatable undercut etch profile (shown in FIG. 5).

Figure 5:
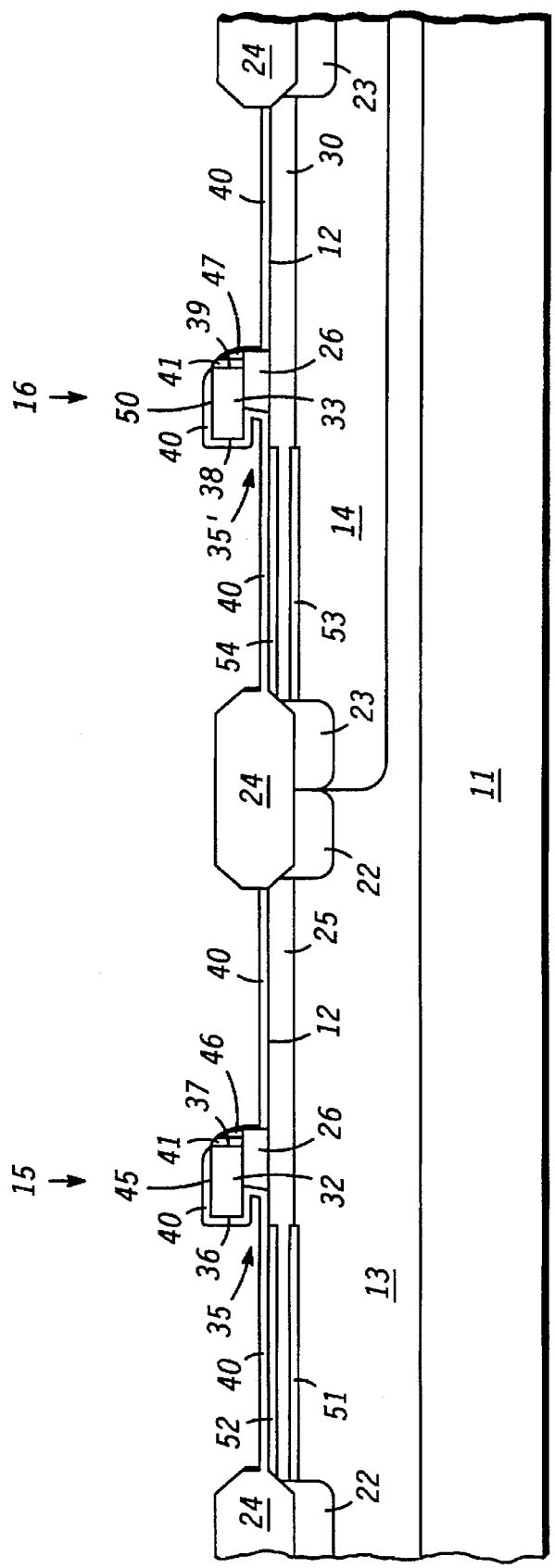

Now referring to FIG. 5, a layer of photoresist (not shown) is formed on subportions of gate shunt portions 32 and 33 and on spacers 46 and 47. Spacers 46' and 47' and the portions of oxide layers 26 and 28 which are not covered by the layer of photoresist are removed via a sequence of isotropic etches, i.e., a first etch step to remove spacers 46' and 47' and a second etch step to remove portions of oxide layer 26 between gate shunt portion 32 and a first portion of major surface 12 as well as the portion of oxide layer 26 between gate shunt portion 33 and a second portion of major surface 12. In other words, gate shunt portions 32 and 33 are undercut on one side to form a cavity 35 underneath gate shunt portion 32, i.e., between gate shunt portion 32 and the first portion of major surface 12 and a cavity 35' underneath gate shunt portion 33, i.e., between gate shunt portion 33 and the second portion of major surface 12. The layer of photoresist is removed. Preferably, the width of the removed portions of oxide layer 26 between gate shunt portions 32 and 33 and the respective portions of major surface 12 have a width of approximately the thickness of the oxide layer 26.

Still referring to FIG. 5, a screen oxide 40 is formed on the exposed portions of gate shunt portions 32 and 33, respectively, and on the exposed portions of major surface 12. By way of example, oxide layer 40 has a thickness ranging from approximately 100 angstroms to approximately 200 angstroms, with a nominal thickness of approximately 150 angstroms. Although oxide layer 40 is also formed on field oxide regions 24 and oxide layer 26, it should be noted that to simplify the description of the present invention, these portions of oxide layer 40 are not shown. A layer of photoresist (not shown) is formed on portions of oxide 40 disposed on gate shunt portions 32 and 33, spacers 46 and 47, portions of oxide layer 40 adjacent sides 37 and 39, and portions of field oxide regions 24. This layer of photoresist serves as an implant block mask.

An enhanced dopant region 51 is formed by doping a portion of P-type epitaxial layer 13 with an impurity material of P conductivity type such as, for example, boron. More particularly, the boron is implanted into a portion of P-type epitaxial layer 13 to form dopant region 51. Dopant region 51 is laterally aligned to field oxide region 24 of N-channel transistor 15 and oxide layer 40 disposed on side 36 of gate shunt portion 32. It should be noted that dopant region 51 is spaced apart from major surface 12. A suitable set of implant parameters includes implanting the P type impurity material at a dose ranging from approximately $2 \times 10^{12}$ atoms/cm$^2$ to approximately $2 \times 10^{13}$ atoms/cm$^2$ at an implant energy ranging from approximately 40 KeV to approximately 100 KeV. Thus, the boron that forms dopant region 51 is implanted into P-type epitaxial layer 13 to a depth or distance ranging between approximately 1,500 and approximately 3,000 angstroms. The impurity materials or dopant forming dopant region 51 serve to provide punch-through protection for N-channel transistor 15.

An enhanced dopant region 52 is formed by doping another portion of P-type epitaxial layer 13 with boron. By way of example, implant parameters for the formation of dopant region 52 include a dose ranging from approximately $5 \times 10^{11}$ atoms/cm$^2$ to approximately $1 \times 10^{13}$ atoms/cm$^2$ and a suitable implant energy ranging from approximately 10 KeV to approximately 20 KeV. Thus the boron that forms dopant region 52 is implanted into a portion of P-type epitaxial layer 13 to a depth or distance ranging from approximately 200 to approximately 1,200 angstroms. The impurity materials forming dopant region 52 serve to adjust the threshold voltage of N-channel transistor 15. The layer of photoresist is removed and a layer of photoresist (not shown) is formed on portions of screen oxide 40 disposed on gate shunt portions 32 and 33, spacer 47, portions of oxide layer 26 adjacent spacer 47, portions of oxide layer 26 over P-type epitaxial layer 13, and portions of field oxide regions 24. This layer of photoresist also serves as an implant block mask.

An enhanced dopant region 53 is formed by doping a portion of N-well 14 with an impurity material of N conductivity type such as, for example, phosphorus. More particularly, the phosphorus is implanted into N-well 14 to form dopant region 53. It should be noted that dopant region 53 is spaced apart from surface 12. A suitable set of implant parameters includes implanting the N type impurity material at a dose ranging from approximately $2 \times 10^{12}$ atoms/cm$^2$ to approximately $2 \times 10^{13}$ atoms/cm$^2$ at an implant energy ranging from approximately 80 KeV to approximately 200 KeV. Thus, the N type impurity material of the implant step that forms dopant region 53 is implanted into N-well 14 to a depth or distance ranging from approximately 1,500 to approximately 3,000 angstroms. The impurity materials forming dopant region 53 serve to provide punch-through protection for P-channel transistor 16.

An enhanced dopant region 54 is formed by doping another portion of N-well 14 with phosphorus. By way of example, the phosphorus is implanted into N-well 14 to form dopant region 54. Suitable implant parameters for the formation of dopant region 54 include a dose ranging from approximately $5 \times 10^{11}$ atoms/cm$^2$ to approximately $1 \times 10^{13}$ atoms/cm$^2$ and a suitable implant energy ranging from approximately 20 KeV to approximately 40 KeV. Thus, the N type impurity material of the implant step that forms dopant region 54 is implanted into N-well 14 to a depth or distance ranging from approximately 200 to 1,200 angstroms. The impurity materials forming dopant region 54 serve to adjust the threshold voltage of P-channel transistor 16. The layer of photoresist is removed.

Figure 6:
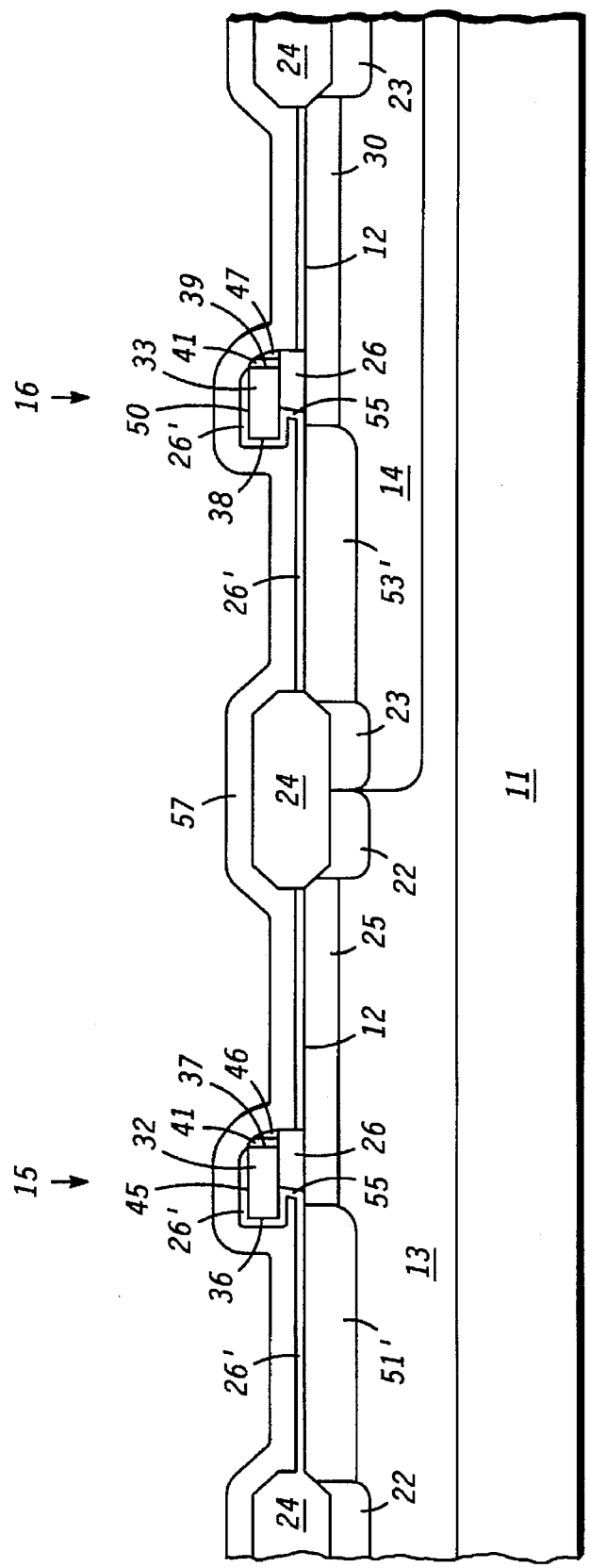

Now referring to FIG. 6, screen oxide 40 is removed from gate shunt portions 32 and 33, respectively, and portions of major surface 12, thereby exposing subportions of gate shunt portions 32 and 33 and portions of major surface 12 and forming oxide extensions 55. An oxide layer 26' is formed on the exposed portions of major surface 12 and the exposed regions of gate shunt portions 32 and 33.

One of a layer of semiconductor material or a conductor material 57 including, for example, amorphous silicon, single crystal silicon, polysilicon, tungsten, or the like, is formed on oxide layers 24, 26', the remaining portions of oxide layer 41, and spacers 46 and 47. By way of example, a conformal layer of polysilicon 57 having a thickness ranging between approximately 1,000 angstroms and approximately 2,500 angstroms is deposited on oxide layers 24, 26', 41, and on spacers 46 and Nominally, polysilicon layer 57 has a thickness of approximately 1,750 angstroms. Although dopant regions 51 and 52 are initially spaced apart, it should be noted that they diffuse towards each other and form a single dopant region 51'. Likewise, dopant regions 53 and 54 diffuse towards each other and form a single dopant region 53'.

Figure 7:
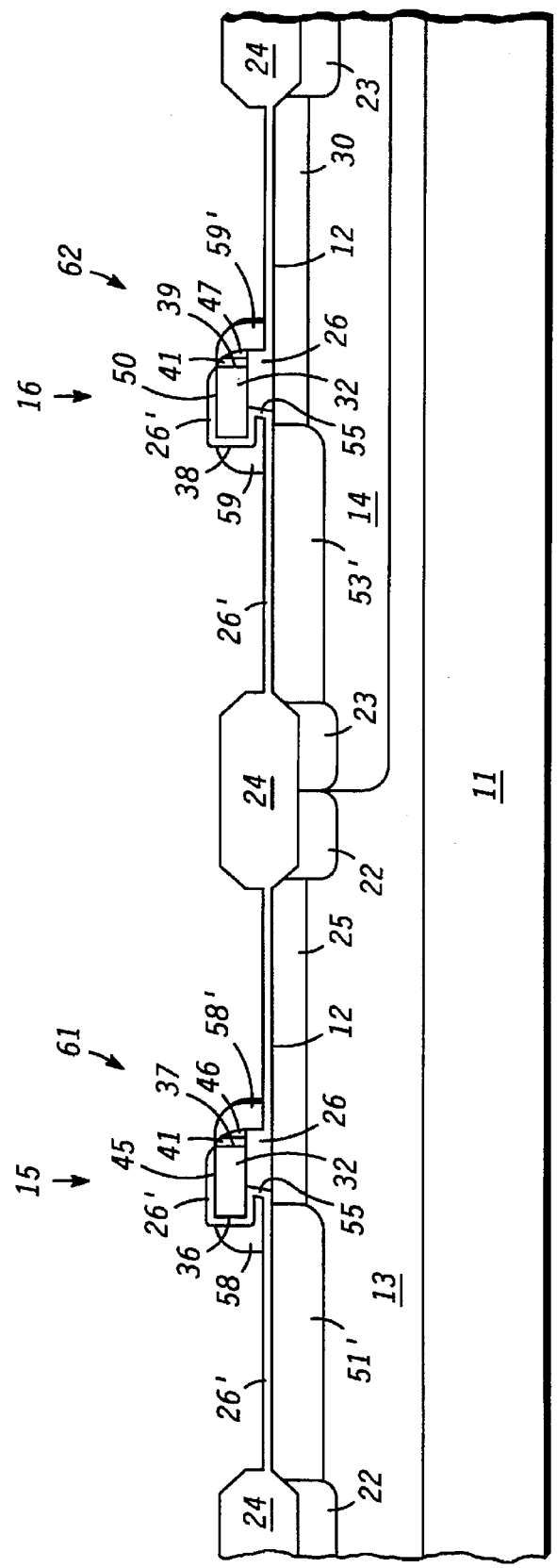

Now referring to FIG. 7, polysilicon layer 57 is anisotropically etched to form gate extensions 58 and 59 adjacent sides 36 and 38, respectively. It should be noted that gate extensions 58 and 59 are spaced apart from the respective sides 36 and 38 by portions of oxide layer 26'. In addition, extensions 58' and 59' are formed adjacent spacers 46 and 47, respectively. The anisotropic etch step that forms gate extensions 58, 58', 59, and 59' stops on or in oxide layer 26'. Thus, gate structure 61 comprises a gate shunt portion 32 formed from a first polysilicon portion on the oxide layer 26 of a first width and a gate extension portion 58 formed from a second polysilicon portion on a portion of oxide layer 26' of a second width, wherein the second width is less than the first width. Likewise, gate structure 62 comprises a gate shunt portion 33 formed from a polysilicon portion on the oxide layer 26 of the first width and a gate extension portion 59 formed from a another polysilicon portion on a portion of oxide layer 26' of the second width.

Figure 8:
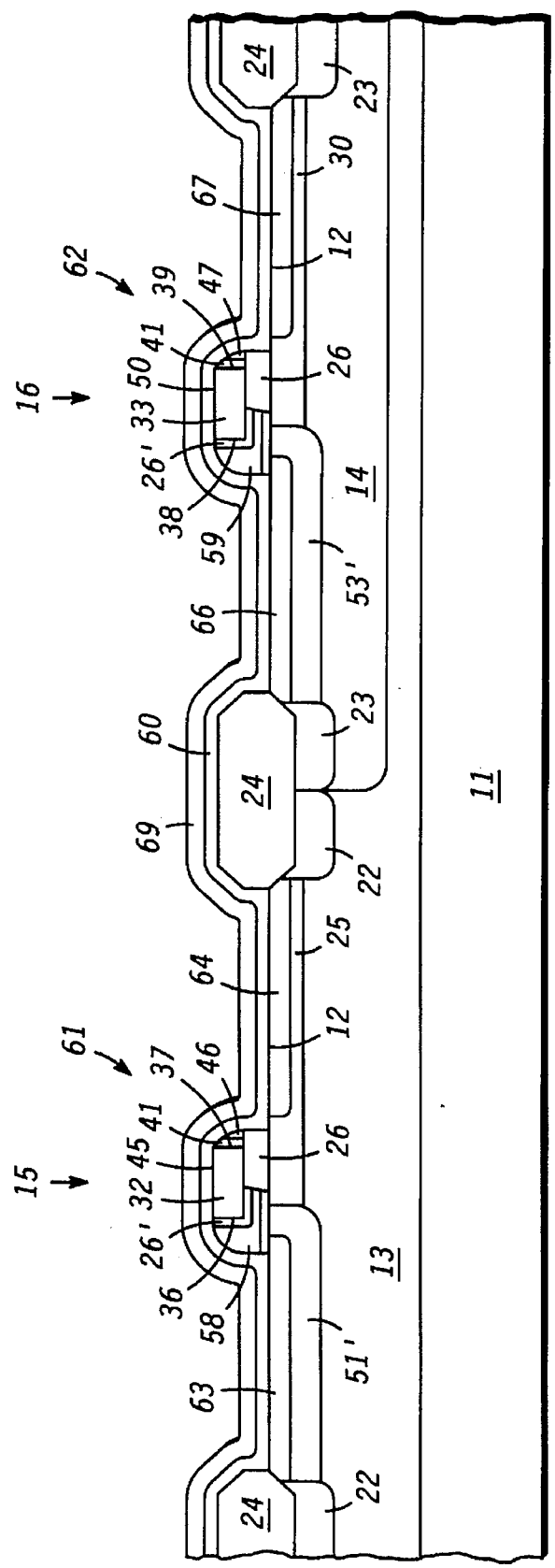

Now referring to FIG. 8, a layer of photoresist (not shown) is formed on gate shunt portions 32 and 33, gate extensions 58 and 59, and the portions of oxide layer 26' adjacent gate extensions 58 and 59. In other words, gate extensions 58' and 59' and the portions of oxide layer 26' adjacent gate extensions 58' and 59' are uncovered by photoresist, i.e., they are exposed. The layer of photoresist serves as an etch protect mask. Gate extensions 58' and 59' and spacers 46 and 47 are removed using, for example, an isotropic plasma etch. Although spacers 46 and 47 are shown as being completely removed, it should be noted that they may be reduced in size. In addition, the exposed portions of oxide layer 26' are also removed. The layer of photoresist is removed.

It should be understood that gate extension 58 cooperates with gate shunt portion 32 and the portions of oxide layer 26' on P-type epitaxial layer 13 to form a gate structure 61. Likewise, it should be understood that gate extension 59 cooperates with gate shunt portion 33 and a portion of oxide layer 26' on N-well 14 to form gate structure 62. The portions of oxide layer 26' between gate extension 58 and major surface 12 and between gate extension 59 and major surface 12 serve as active gate oxide.

An oxide layer 60 is conformally deposited on field oxide regions 24, and the remaining portions of oxide layer 26', oxide layer 41, spacers 46 and 47, and gate extensions 58 and 59. By way of example, oxide layer 60 has a thickness ranging from approximately 100 angstroms to approximately 300 angstroms, wherein a nominal thickness of oxide layer 60 is approximately 150 angstroms.

A layer of photoresist (not shown) is formed on the portions of the layer of dielectric material 60 over gate structures 61 and 62 and the portions of oxide layer 60 over N-well 14 that are adjacent to gate structure 62. In other words the layer of photoresist serves as an implant protect mask preventing P-channel transistor 16 from being doped by a source/drain implant for N-channel transistor 15. A source/drain implant is performed to form a source region 63 and a drain region 64. In addition, the source/drain implant further dopes gate structure 61. A suitable set of implant parameters for the source/drain implant includes implanting an N type impurity material such as arsenic, at a dose in the range of approximately $1 \times 10^{15}$ atoms/cm$^2$ to approximately $1 \times 10^{16}$ atoms/cm$^2$, and a suitable implant energy ranges from approximately 60 KeV to approximately 120 KeV.

The layer of photoresist is removed and another layer of photoresist (not shown) is formed on the portion of the layer of dielectric material 60 above gate structures 61 and 62 and the portions of oxide layer 60 over P-type epitaxial layer 13 adjacent gate structure 61. In other words the layer of photoresist serves as an implant protect mask preventing N-channel transistor 15 from being doped by a source/drain implant of the P-channel transistor 16. A source/drain implant of, for example, boron is performed to form a source region 66 and a drain region 67. In addition, the source/drain implant further dopes gate structure 62. A suitable set of implant parameters for the source/drain implant includes implanting a P type impurity material such as boron, at a dose in the range of approximately $1 \times 10^{15}$ atoms/cm$^2$ to approximately $5 \times 10^{15}$ atoms/cm$^2$, and a suitable implant energy ranges from approximately 5 KeV to approximately 15 KeV. The layer of photoresist is removed.

Still referring to FIG. 8, a conformal layer of dielectric material 69 is formed on layer of dielectric material 60. By way of example, layer of dielectric material 69 is silicon nitride having a thickness ranging from approximately 1,000 angstroms to approximately 2,250 angstroms. A nominal thickness of silicon nitride layer 69 is 2,000 angstroms.

Figure 9:
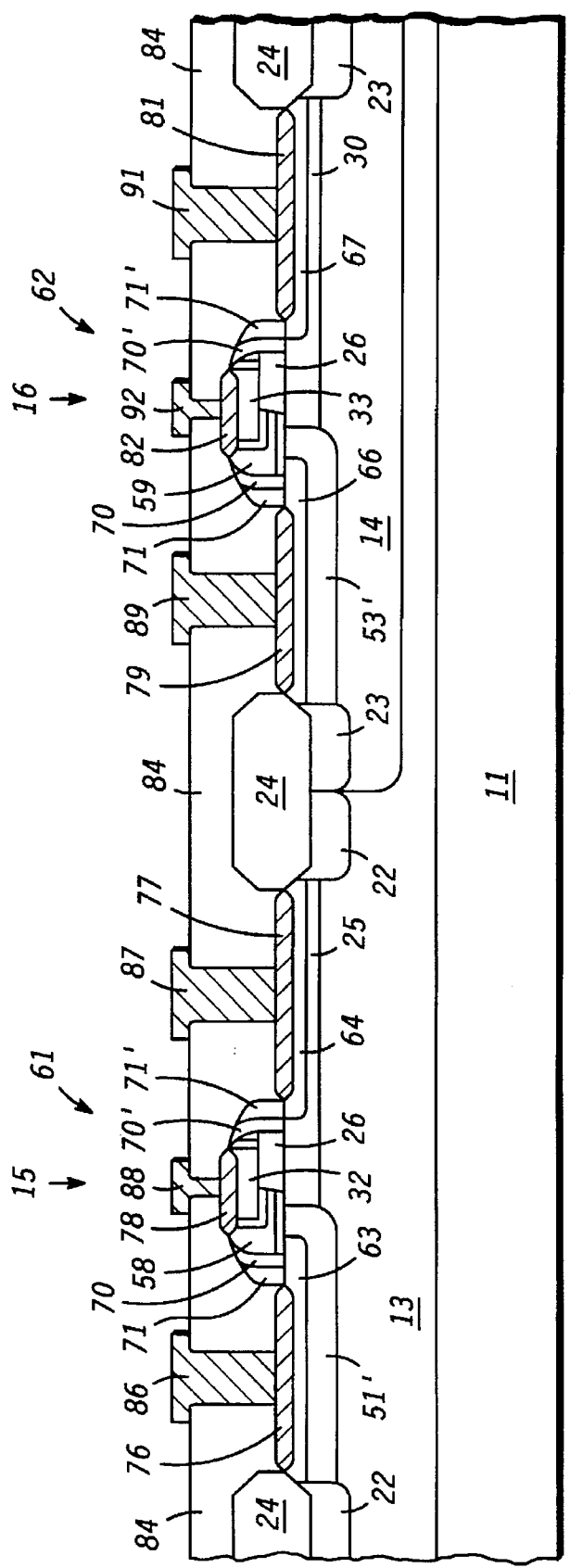

Now referring to FIG. 9, silicon nitride layer 69 and oxide layer 60 are anisotropically etched to form oxide spacers 70 and nitride spacers 71 adjacent sides 36 and 37. Further, oxide spacers 70' and nitride spacers 71' are formed adjacent the remaining portions of spacers 46 and 47. In addition, the anisotropic etch step exposes gate shunt portions 32 and 33 and gate extensions 58 and 59 of gate structures 61 and 62, respectively, as well as the portion of major surface 12 adjacent spacers 71 and 71'. Using techniques well known in the art, a silicide 76 is formed on dopant region 63, a silicide 77 is formed on dopant region 64, a silicide 78 is formed on portions of gate structure 61, a silicide 79 is formed on dopant region 66, a silicide 81 is formed on dopant region 67, and a silicide 82 on portions of gate structure 62. It should be noted that silicide 78 serves as a conductive strap coupling gate shunt portion 32 to gate extension 58 and silicide 82 serves as a conductive strap coupling gate shunt portion 33 to gate extension 59.

A layer of dielectric material 84, such as, for example, oxide is formed on field oxide regions 24, spacers 71 and 71', and silicide 76, 77, 78, 79, 81, and 82. Openings are formed in oxide layer 84 to expose portions of silicide 76, 77, 78, 79, 81, and 82. Using techniques well known in the art, electrical conductors or electrodes are formed which contact the exposed portions of silicide 76, 77, 78, 79, 81, and 82. More particularly, a source conductor 86 contacts silicide 76, a drain conductor 87 contacts silicide 77, and a gate conductor 88 contacts silicide 78. Thus, source, drain, and gate conductors, 86, 87, and 88, respectively, form conductors for N-channel transistor 15. Likewise, a source conductor 89 contacts silicide 79, a drain conductor 91 contacts silicide 81, and a gate conductor 92 contacts silicide 82. Thus, source, drain, and gate conductors, 89, 91, and 92, respectively, form conductors for P-channel transistor 16. It should be understood that gate conductors 88 and 92 are highly simplified illustrations to show a gate conductor electrically coupled to a gate structure.

Figure 10:
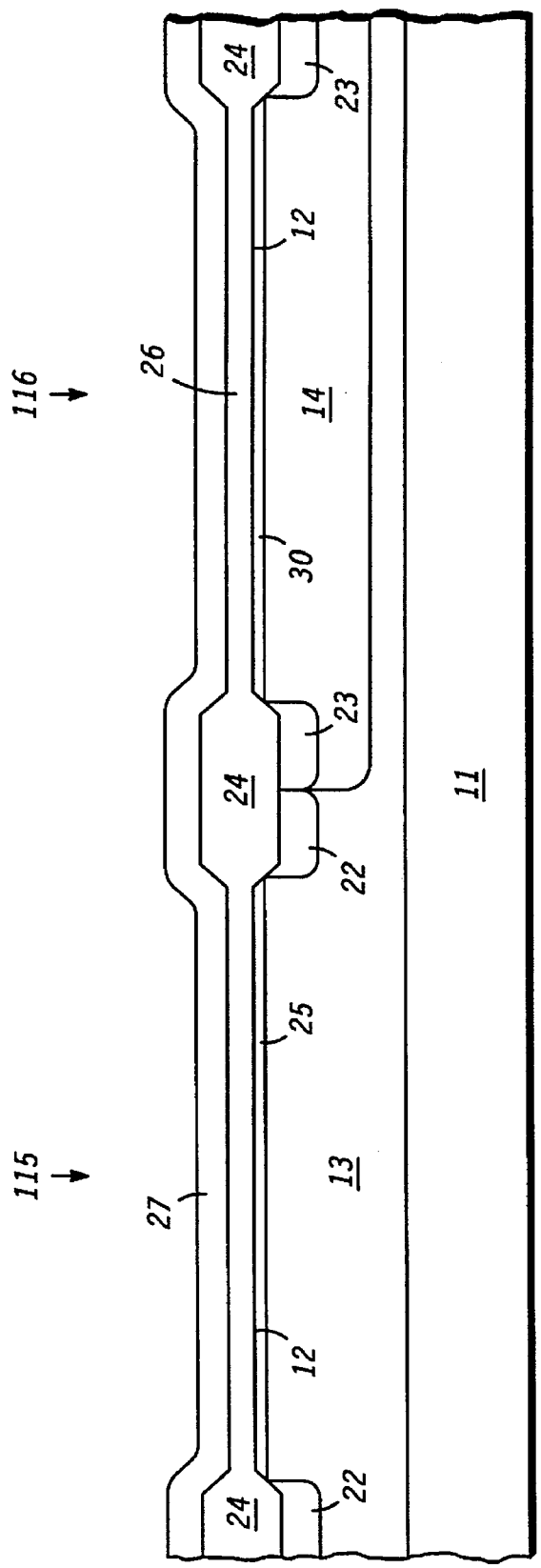
FIGS. 10–18 illustrate highly enlarged cross-sectional views of a portion of insulated gate field effect transistors during processing in accordance with a second embodiment of the present invention.

FIGS. 10–18 illustrate highly enlarged cross-sectional views of a portion of complementary insulated gate field effect transistors 100 during processing in accordance with a second embodiment of the present invention. Complementary insulated gate field effect transistors 100 include an N-channel transistor 115 fabricated in a portion of a P-type epitaxial layer 13 and a P-channel transistor 116 fabricated in a portion of an N-well 14. FIG. 10 illustrates the partially completed insulated gate field effect transistor 100 after formation of oxide layer 26 and layer of polysilicon 27. It should be noted that the formation of epitaxial layer 13, N-well 14, field implant regions 22 and 23, field oxide regions 24, dopant regions 25 and 30, oxide layer 26 and polysilicon layer 27 have been described with reference to FIG. 1. It should be understood that the locations of N-channel transistor 115 and P-channel transistor 116 in FIGS. 10–18 are included to show the locations of these structures and therefore more clearly describe the invention.

Figure 11:
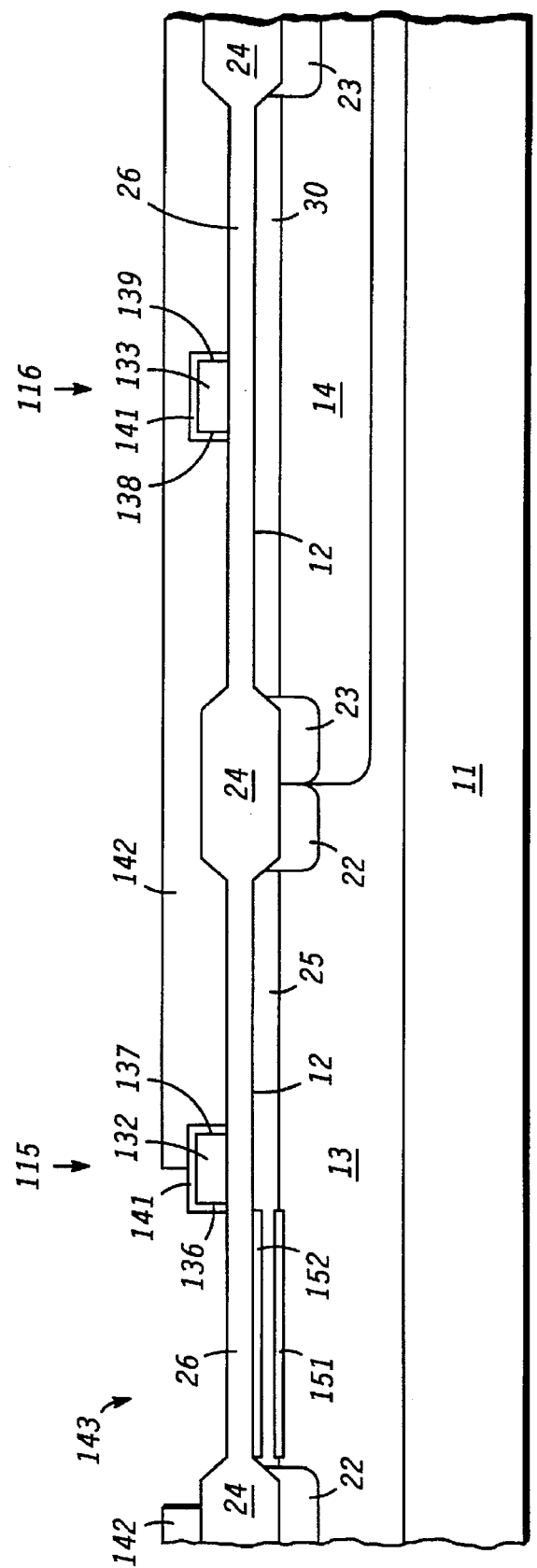

Now referring to FIG. 11, gate shunt portions 132 and 133 of the gate structures are formed over P-type epitaxial layer 13 and N-well 14, respectively. Gate shunt portion 132 having sides 136 and 137 and gate shunt portion 133 having sides 138 and 139 may be formed by anisotropically etching polysilicon layer 27. By way of example, gate shunt portions 132 and 133 are formed by coating polysilicon layer 27 with a layer of photoresist (not shown), exposing the portions of polysilicon layer 27 to be removed (using photolithographic techniques), and anisotropically etching the exposed portions of polysilicon layer 27. Thus, gate shunt portions 132 and 133 are formed from portions of polysilicon layer 27. It should be understood that gate shunt portions 132 and 133 form part of gate structures 161 and 162, respectively, which are further described in the description of FIG. 16.

Still referring to FIG. 11, a layer of oxide 141 is formed on gate shunt portions 132 and 133. By way of example, oxide layer 141 is formed by thermally oxidizing gate shunt portions 132 and 133. A suitable thickness range for oxide layer 141 is between approximately 50 angstroms and approximately 250 angstroms and a nominal thickness of oxide layer 141 is approximately 100 angstroms. Although, the formation of oxide layer 141 by thermal oxidation increases the thicknesses of field oxide regions 24 and oxide layer 26, the increased thicknesses are not shown to simplify the description of the present invention.

A layer of photoresist 142, having an opening 143, is formed on oxide layer 141, field oxide regions 24 and oxide layer 26. Opening 143 exposes a sub-portion of gate shunt portion 132 and a portion of oxide layer 26 adjacent side 136 of gate shunt portion 132. Layer of photoresist 142 serves as an implant block mask. In accordance with the second embodiment, an enhanced dopant region 151 is formed by doping a portion of P-type epitaxial layer 13 with an impurity material of P conductivity type such as, for example, boron. More particularly, the boron is implanted into P-type epitaxial layer 13 to form a dopant region 151. It should be noted that dopant region 151 is spaced apart from surface 12. A suitable set of implant parameters for forming dopant region 151 includes implanting the boron at a dose in the range of approximately $2\times10^{12}$ atoms/cm$^2$ and approximately $2\times10^{13}$ atoms/cm$^2$ and an implant energy ranging between approximately 40 KeV and approximately 100 KeV. Thus, the boron forming dopant region 151 is implanted into P-type epitaxial layer 13 at a depth or distance ranging from approximately 1,500 to 3,000 angstroms. The impurity materials forming dopant region 151 serves to provide punch-through protection for N-channel transistor 115.

An enhanced dopant region 152 is formed by doping another portion of P-type epitaxial layer 13 with boron. By way of example, another implant is performed wherein the boron is implanted into P-type epitaxial layer 13 to a form dopant region 152. Suitable implant parameters for the formation of dopant region 152 include implanting the boron at a dose in the range of approximately $5\times10^{11}$ atoms/cm$^2$ and approximately $1\times10^{13}$ atoms/cm$^2$ and a suitable implant energy ranging between approximately 10 KeV and approximately 20 KeV. Thus, the boron forming dopant region 152 is implanted into P-type epitaxial layer 13 to a depth or distance ranging from approximately 200 to approximately 1,200 angstroms and serves to adjust the threshold voltage of N-channel transistor 115.

Figure 12:
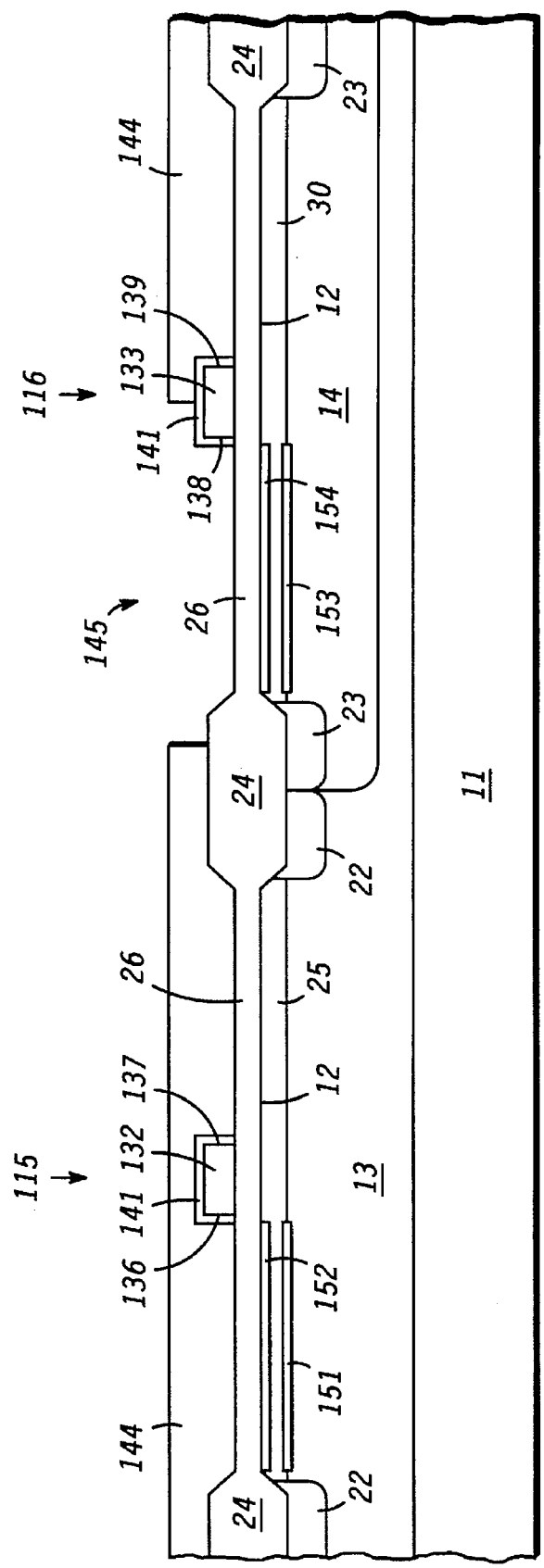

Now referring to FIG. 12, the layer of photoresist is removed and a layer of photoresist 144, having an opening 145, is formed on oxide layer 141, field oxide regions 24, and portions of oxide layer 26. Opening 145 exposes a subportion of gate shunt portion 133 and a portion of oxide layer 26 adjacent side 138 of gate shunt portion 133. Layer of photoresist 144 serves as an implant block mask.

In accordance with the second embodiment of the present invention, an enhanced dopant region 153 is formed by doping a portion of N-well 14 with an impurity material of N conductivity type such as, for example, phosphorus. More particularly, the phosphorus is implanted into N-well 14 to form dopant region 153. It should be noted that dopant region 153 is spaced apart from surface 12. A suitable set of implant parameters includes implanting the P type impurity material at a dose in the range of approximately $2\times10^{12}$ atoms/cm$^2$ and approximately $2\times10^{13}$ atoms/cm$^2$ and an implant energy ranging between approximately 40 KeV and approximately 100 KeV. Thus, the N type impurity material of the implant step that forms dopant region 153 is implanted into N-well 14 to depth or distance ranging from approximately 1,500 to 3,000 angstroms. The implant forming dopant region 153 serves to provide punch-through protection for P-channel transistor 116.

An enhanced dopant region 154 is formed by doping another portion of N-well 14 with phosphorus. By way of example, another implant is performed wherein the impurity material of N conductivity type is implanted into N-well 14 to form dopant region 154. Suitable implant parameters for the formation of dopant region 154 include a dose ranging between approximately $5\times10^{11}$ atoms/cm$^2$ and approximately $1\times10^{13}$ atoms/cm$^2$ and a suitable implant energy ranging between approximately 20 KeV and approximately 40 KeV. Thus, the N type impurity material of the implant step that forms dopant region 154 is implanted into N-well 14 to a depth or distance ranging from approximately 200 to approximately 1,200 angstroms. The implant forming dopant region 154 serves to adjust the threshold voltage of P-channel transistor 116. Layer of photoresist 144 is removed.

Figure 13:
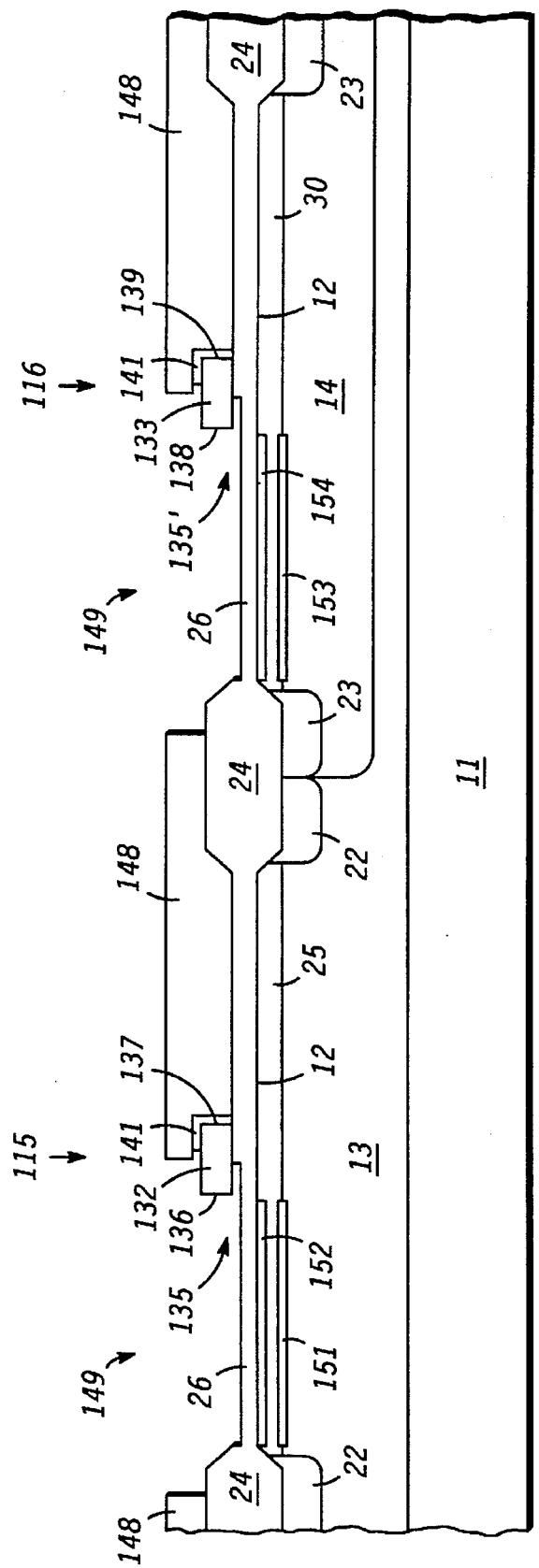

Now referring to FIG. 13, a layer of photoresist 148, having openings 149, is formed on oxide layer 141. Openings 149 expose a sub-portion of gate shunt portion 132, a portion of oxide layer 26 adjacent side 136 of gate shunt portion 132, a sub-portion of gate shunt portion 133, and a portion of oxide layer 26 adjacent side 138 of gate shunt portion 133. Layer of photoresist 148 serves as an etch protect mask.

The exposed portions of oxide layer 26 and oxide layer 141 are isotropically etched using, for example, a wet hydrofluoric acid etch. In accordance with the second embodiment, the isotropic etch removes approximately 1,000 angstroms of the exposed portions of oxide layer 26 and portions of oxide layer 26 beneath gate shunt portions 132 and 133, i.e., portion of major surface 12 between and gate shunt portions 132 and 133. In other words, the isotropic etch undercuts the portions of oxide layer 26 between major surface 12 and gate shunt portions 132 and 133 and forms cavities 135 and 135', respectively, between gate shunt portion 132 and a first portion of major surface 12 and between gate shunt portion 133 and a second portion of major surface 12. In addition, the isotropic etch removes the exposed portions of oxide layer 141 from gate shunt portions 132 and 133. Layer of photoresist 148 is removed.

Figure 14:
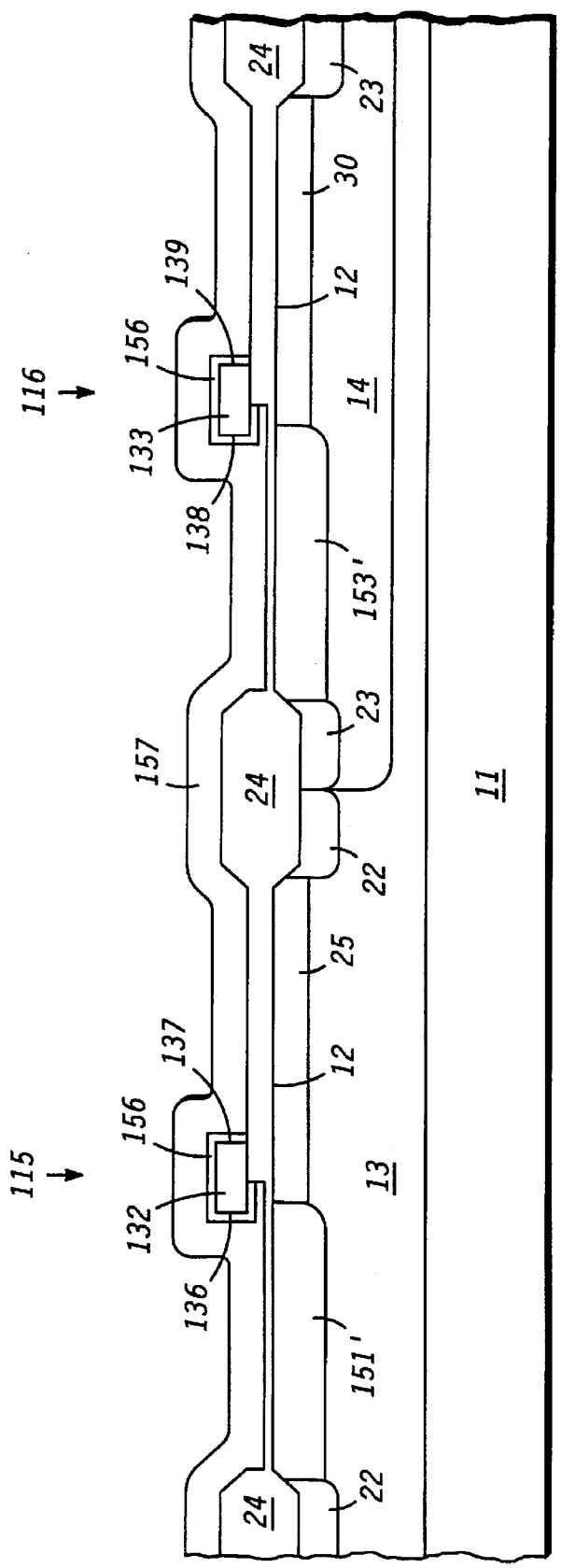

Now referring to FIG. 14, a layer of oxide 156 is formed on gate shunt portions 132 and 133. It should be noted that oxide layer 156 is a thin oxide layer having a thickness ranging between approximately 50 angstroms and approximately 150 angstroms. A nominal thickness of oxide layer 156 is approximately 90 angstroms. Although, oxide layer 156 is also formed on field oxide regions 24 and oxide layer 26, it should be noted that oxide layer 156 merely thickens or increases the thicknesses of field oxide regions 24 and oxide layer 26. Thus, to simplify the description of the present invention, the portions of oxide layer 156 formed on field oxide regions 24 and oxide layer 26 are not shown. Although oxide layer 156 is also formed on oxide layer 141, to further simplify the description of the second embodiment oxide layers 141 and 156 are shown as a single oxide layer identified by the reference numeral 156.

One of a layer of semiconductor material or a conductor material 157 including, for example, amorphous silicon, single crystal silicon, polysilicon, tungsten, or the like, is formed on oxide layers 24, 26, and oxide layer 156. By way of example, a conformal layer of polysilicon 157 having a thickness ranging between approximately 1,000 angstroms and approximately 2,500 angstroms is deposited on oxide layers 24 and oxide layer 156. Nominally, polysilicon layer 157 has a thickness of approximately 1,750 angstroms. Although dopant regions 151 and 152 are initially spaced apart, it should be noted that they diffuse towards each other and form a single dopant region 151'. Likewise, dopant regions 153 and 154 diffuse towards each other and form a single dopant region 153'.

Figure 15:
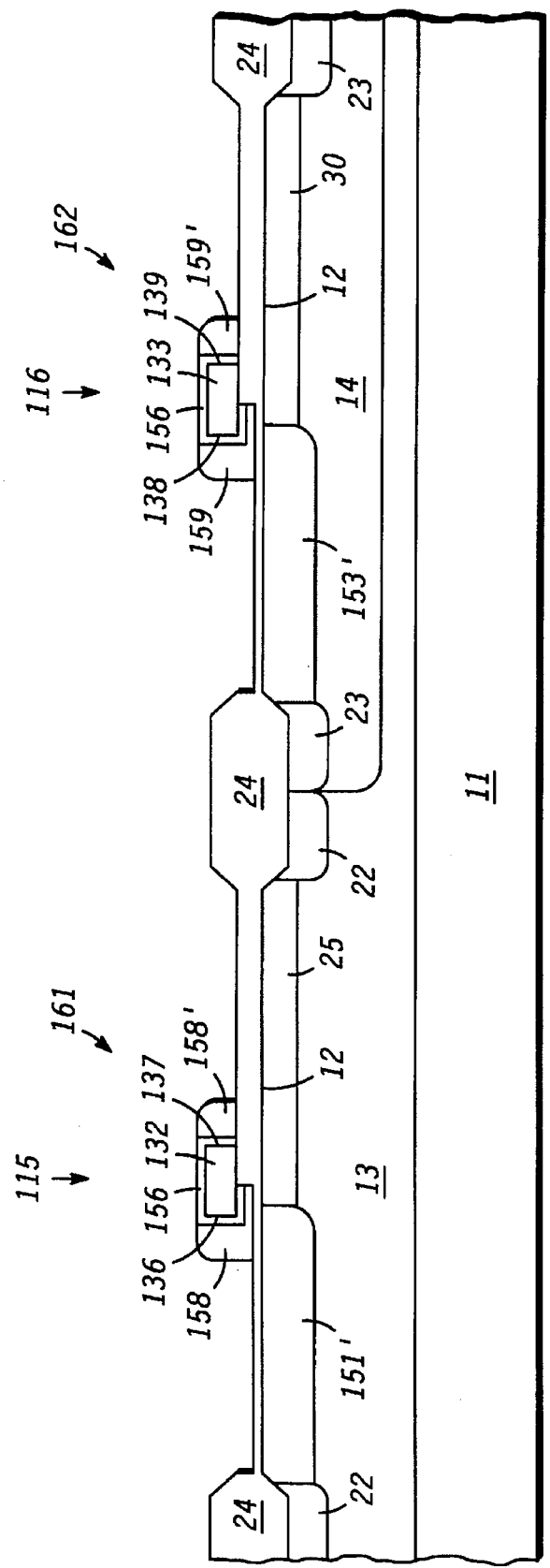

Now referring to FIG. 15, polysilicon layer 157 is anisotropically etched to form gate extensions 158 and 159 adjacent sides 136 and 138, respectively. In addition extensions 158' and 159' are formed adjacent and spaced apart from sides 137 and 139, respectively. Thus, gate structure 161 comprises a gate shunt portion 132 formed from a first polysilicon portion on the oxide layer 26 of a first width and a gate extension portion 158 formed from a second polysilicon portion on a portion of oxide layer 26 of a second width, wherein the second width is less than the first width. Likewise, gate structure 162 comprises a gate shunt portion 133 formed from a polysilicon portion on the oxide layer 26 of the first width and a gate extension portion 159 formed from another polysilicon portion on a portion of oxide layer 26 of the second width.

Figure 16:
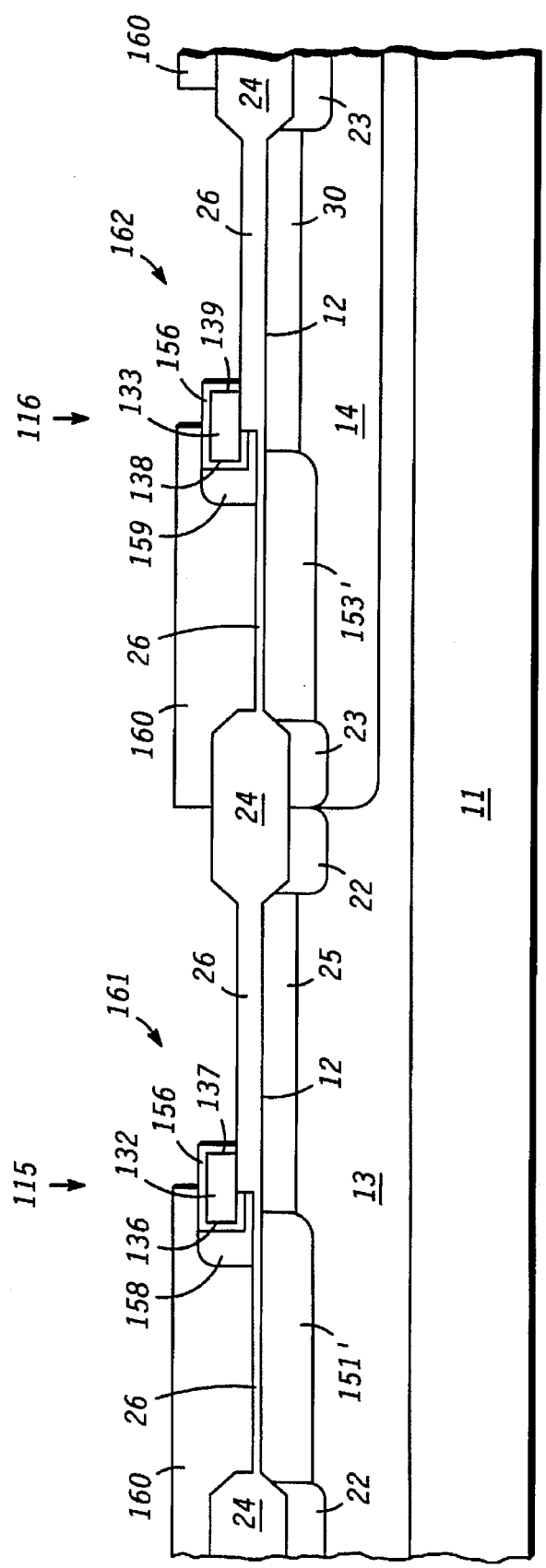

Now referring to FIG. 16, a layer of photoresist 160 is formed on portions 132 and 133, gate extensions 158 and 159 and the portions of oxide layer 26 adjacent gate extensions 158 and 159. In other words, gate extensions 158' and 159' and the portions of oxide layer 26 adjacent gate extensions 158' and 159' are exposed. Layer of photoresist 160 serves as an etch protect mask. Gate extensions 158' and 159' are removed using, for example, an isotropic plasma etch, wherein the isotropic etch stops or endpoints on the exposed portions of oxide layer 26. Layer of photoresist 160 is removed.

Figure 17:
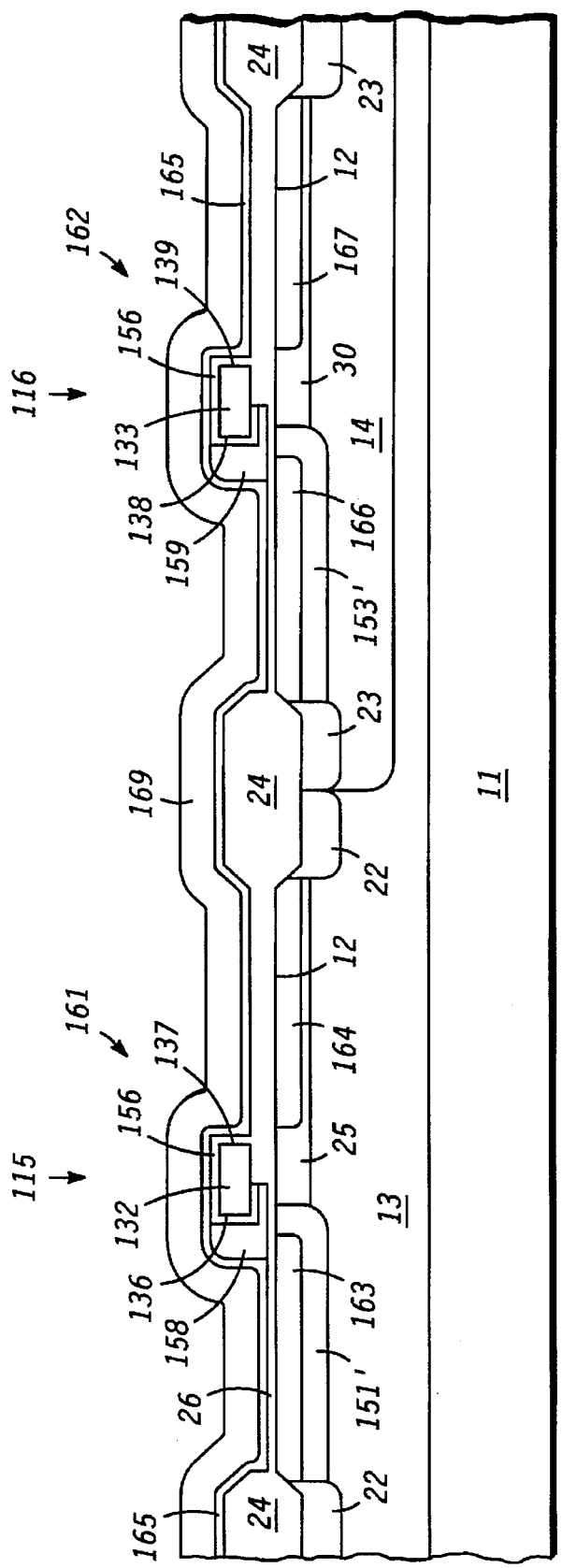

Now referring to FIG. 17, a conformal layer of dielectric material 165 is formed on gate shunt portions 132 and 133, gate extensions 158 and 159, and the exposed portions of oxide layer 26. By way of example layer of dielectric material 165 is a deposited TEOS oxide having a thickness ranging from approximately 100 angstroms to approximately 300 angstroms, and a nominal thickness is 150 angstroms. A layer of photoresist (not shown) is formed on the portion of the layer of dielectric material 165 above gate shunt portions 133, gate extension 159 and the portion of major surface 12 of N-well 14. In other words, the layer of photoresist serves as an implant protect mask preventing P-channel transistor 116 from being doped by a source/drain implant for N-channel transistor 115. A source/drain implant is performed to form a source region 163 and a drain region 164. In addition, the source/drain implant further dopes the gate structure 161. A suitable set of implant parameters for the source/drain implant includes implanting an N type impurity material such as arsenic, at a dose ranging between approximately $1 \times 10^{15}$ atoms/cm$^2$ and approximately $1 \times 10^{16}$ atoms/cm$^2$, and an implant energy ranging between approximately 60 KeV and approximately 160 KeV.

The layer of photoresist is removed and another layer of photoresist (not shown) is formed on the portions of layer of dielectric material 165 on gate shunt portion 132, extension 158, and the portion of major surface 12 of P-well 13. In other words the layer of photoresist serves as an implant protect mask preventing N-channel transistor 115 from being doped by a source/drain implant for P-channel transistor 116. A source/drain implant is performed to form a source region 166 and a drain region 167. In addition, the source/drain implant further dopes the gate structure 162. A suitable set of implant parameters for the source/drain implant includes implanting a P type impurity material such as boron, at a dose ranging between approximately $1 \times 10^{15}$ atoms/cm$^2$ and approximately $5 \times 10^{15}$ atoms/cm$^2$, and an implant energy ranging from approximately 5 KeV to approximately 15 KeV. The layer of photoresist is removed. An anneal such as, for example, a rapid thermal anneal is performed to anneal any damage caused by the implant and to redistribute the impurity material in the source, drain, and gate regions.

Still referring to FIG. 17, a conformal layer of dielectric material 169 is formed on layer of oxide layer 165. By way of example, layer of dielectric material 169 is silicon nitride having a thickness ranging between approximately 1,000 angstroms and approximately 2,250 angstroms. A nominal thickness of silicon nitride layer 169 is 2,000 angstroms.

Figure 18:
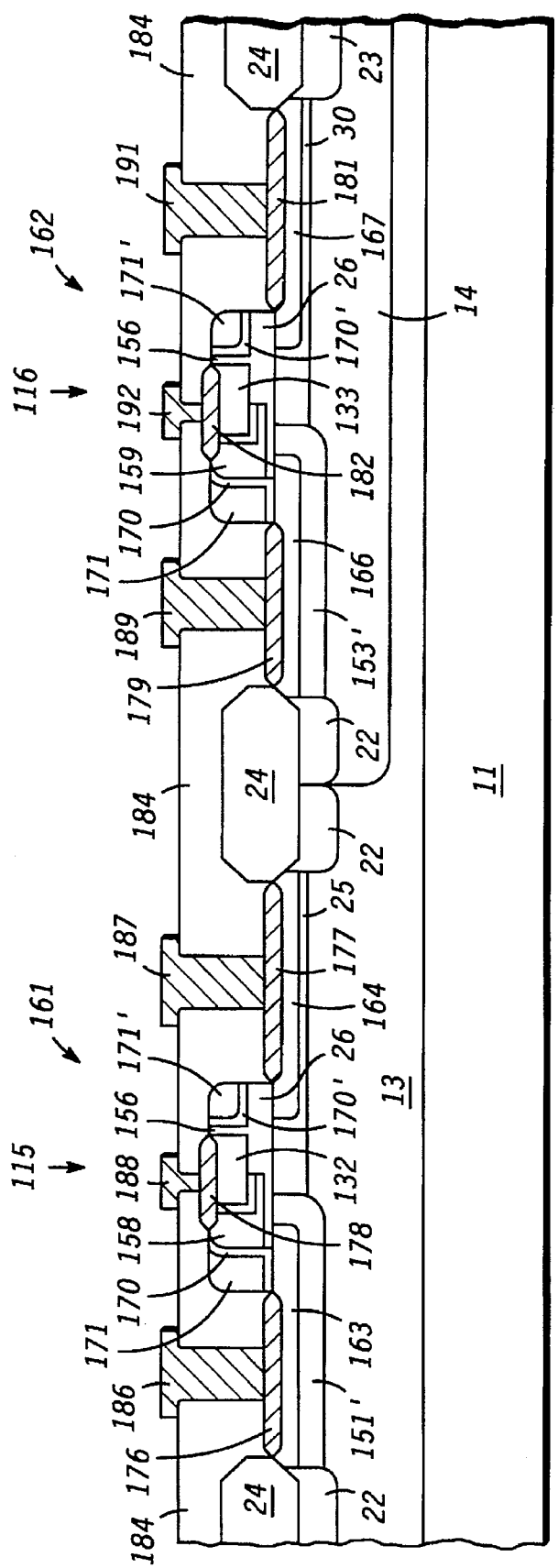

Now referring to FIG. 18, a sequence of anisotropic etches is used to etch silicon nitride layer 169 and oxide layer 165. For example, silicon nitride layer 169 is anisotropically etched to form nitride spacers 171, wherein the etching of silicon nitride layer 169 stops on oxide layer 165. Then oxide layer 165 is anisotropically etched to form oxide spacers 170. Thus, spacers 171 and 170 are formed adjacent sides 136 and 138. Further, oxide spacers 170' and nitride spacers 171' are formed in contact with the portions of oxide layer 156 adjacent sides 137 and 139. In addition, the anisotropic etch step exposes the portions of major surface 12 adjacent spacers 171 and 171' as well as gate shunt portions 132 and 133 and gate extensions 158 and 159 of gate structures 161 and 162, respectively. Using techniques well known in the art, a silicide 176 is formed on dopant region 163, a silicide 177 is formed on dopant region 164, a silicide 178 is formed on portions of gate structure 161, a silicide 179 is formed on dopant region 166, a silicide 181 is formed on dopant region 167, and a silicide 182 on portions of gate structure 162.

A layer of dielectric material 184, such as, for example, oxide is formed on field oxide regions 24, spacers 171 and 171', and silicide 176, 177, 178, 179, 181, and 182. Openings are formed in oxide 184 to expose portions of silicide 176, 177, 178, 179, 181, and 182. Using techniques well known in the art electrical conductors are formed which contact the exposed silicide. More particularly, a source conductor 186 contacts silicide 176, a drain conductor 187 contacts silicide 177, and a gate conductor 188 contacts silicide 178. Thus, source, drain, and gate conductors, 186, 187, and 188, respectively, form conductors for N-channel transistor 115. Likewise, a source conductor 189 contacts silicide 179, a drain conductor 191 contacts silicide 181, and a gate conductor 192 contacts silicide 182. Thus, source, drain, and gate conductors, 189, 191, and 192, respectively, form conductors for P-channel transistor 116.

Figure 19:
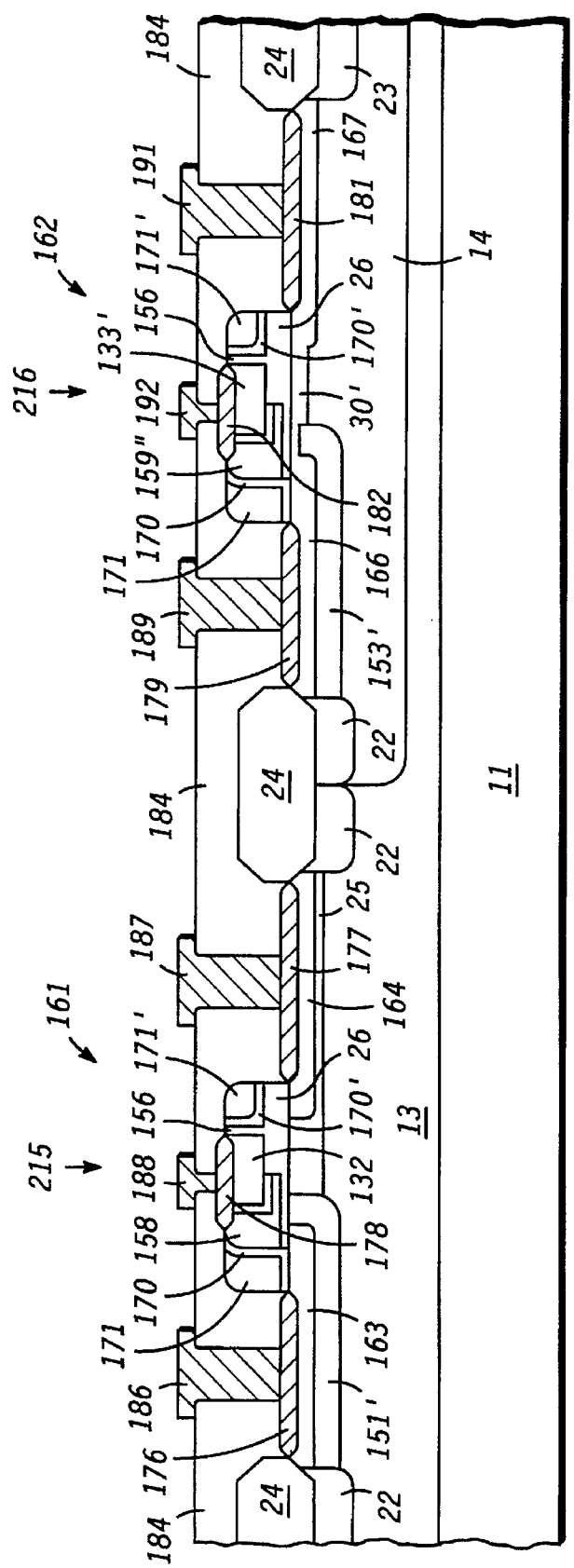
FIG. 19 illustrates a highly enlarged cross-sectional view of insulated gate field effect transistors in accordance with a third embodiment of the present invention.

FIG. 19 illustrates a highly enlarged cross-sectional view of a portion of complementary insulated gate field effect transistors 200 during processing in accordance with a third embodiment of the present invention. Complementary insulated gate field effect transistors 200 include an N-channel transistor 215 fabricated in a portion of a P-type epitaxial layer 13 and a buried P-channel transistor 216 fabricated in a portion of an N-well 14. The process steps for forming complementary insulated gate field effect transistors 200 follows the steps described for manufacturing complementary insulated gate field effect transistors 10 and 100. However, to form buried P-channel transistor 216, two modifications are made to the processes for forming insulated gate field effect transistors 10 and 100. In the first modification, dopant layer 30' is of P conductivity type and has a surface concentration ranging from approximately $7\times10^{16}$ atoms/cm$^3$ to approximately $2\times10^{17}$ atoms/cm$^3$. It should be noted that dopant layer 30 of FIGS. 1–18 is analogous to dopant layer 30' of FIG. 19. A suitable set of implant conditions to obtain the aforementioned surface concentration includes an implant dose ranging from approximately $1\times10^{12}$ atoms per square centimeter (atoms/cm$^2$) to approximately $3\times10^{12}$ atoms/cm$^2$ and an implant energy ranging from approximately 50 kilo-electron volts (KeV) to approximately 200 KeV.

In the second modification (and referring to the processing steps for manufacturing insulated gate field effect transistors 100), gate shunt portion 133 and gate extension portion 159" of gate structure 162' are doped with an impurity material of N conductivity type. More particularly, gate structure 162' is doped during the formation of source and drain regions 166 and 167, respectively. Thus, dopant region 30' is formed at the same time as dopant region 25 and gate shunt portion 133' and gate extension portion 159" are preferably doped at the same time as gate shunt portion 132 and gate extension 158, i.e., gate structures 161 and 162' are preferably doped at the same time. It should be noted that a buried P-channel transistor can be manufactured by including a modification to process steps for forming insulated gate field effect transistors 10 that is similar to the process steps for forming insulated gate field effect transistor 100.

By now it should be appreciated that an insulated gate semiconductor device and a method manufacturing the insulated gate semiconductor device have been provided. In accordance with the present invention, a lightly doped drain extension implant is performed at the beginning stages of manufacture allowing the formation of a gate oxide having a thick portion and a thin portion. Further a gate shunt portion of a gate structure is manufactured on the thick portion of gate oxide and a gate extension is formed on a thin portion of gate oxide. The gate shunt portion reduces the gate resistance without significantly increasing the gate capacitance, i.e. gate to drain and gate to substrate capacitances. Further, the thick portion of the gate oxide also decreases the gate capacitance of the device. The decrease in a gate to drain portion of the gate capacitance decreases a "Miller multiplied" capacitance, thereby increasing the frequency response of the devices of the present invention. It has been determined that insulated gate semiconductor devices manufactured in accordance with the present invention are at least 50 percent faster than prior art insulated gate semiconductor devices. In addition, the use of the gate shunt portion allows nonphotolithographic formation of the gate extensions by deposition and etch techniques. Thus, insulated gate field effect transistors having a channel length of less than 0.2 µm can be manufactured using fabrication facilities designed for devices having gate lengths of 0.5 µm.

We claim:

1. A method for fabricating an insulated gate semiconductor device, comprising the steps of:

providing a semiconductor material of a first conductivity type and having a major surface;

forming a first dopant layer extending from the major surface into the semiconductor material;

forming a first portion of a first gate structure on a first portion of a first layer of dielectric material, the first portion of the first gate structure having first and second sides and spaced apart from the major surface by the first portion of the first layer of dielectric material;

doping at least one portion of the semiconductor material adjacent the first side of the first portion of the first gate structure with impurities of the first conductivity type;

laterally removing a subportion of the first portion of the first layer of dielectric material to form a first cavity, the first cavity extending between the first portion of the first gate structure and the major surface from the first side;

forming a second layer of dielectric material adjacent at least the first portion of the first gate structure;

forming a second portion of the first gate structure, the second portion of the first gate structure spaced apart from the first side of the first gate structure by the second layer of dielectric material filling a portion of the first cavity;

doping a portion of the semiconductor material adjacent the second side of the first portion of the first gate structure and a portion of the semiconductor material adjacent the second side of the second portion of the first gate structure; and doping a portion of the first gate structure.

2. The method of claim 1, wherein the step of laterally removing a subportion of the first portion of the first layer of dielectric material to form a first cavity includes exposing the first side of the first portion of the first gate structure.

3. The method of claim 2, wherein the step of laterally removing a subportion of the first portion of the first layer of dielectric material to form a first cavity includes exposing a portion of the major surface adjacent the first cavity and a portion of the major surface adjacent the first side of the first portion of the first gate structure.

4. The method of claim 3, wherein the step of forming the second layer of dielectric material includes forming the second layer of dielectric material on portions of the major surface adjacent the first and second sides of the first gate structure, on the portion of the major surface below the first gate structure that is exposed, and on the first portion of the first gate structure.

5. The method of claim 1, wherein the step of doping at least one portion of the semiconductor material adjacent the first side of the first portion of the first gate structure includes changing a conductivity type of a portion of the semiconductor material adjacent the major surface to be of the first conductivity type and further including the step of doping the first portion of the first gate structure with impurities of a second conductivity type.

6. The method of claim 1, further including forming the first layer of dielectric material having a thickness of at least 400 angstroms.

7. The method of claim 1, wherein the step of laterally removing a subportion of the first portion of the first layer of dielectric material to form a first cavity includes removing the subportion of the first layer of dielectric material having a width of approximately a thickness of the first layer of dielectric material.

8. The method of claim 1, wherein the step of forming a first portion of a first gate structure includes forming a first polysilicon portion on the first layer of dielectric material having a first width and the step of forming the second portion of a first gate structure includes forming a second polysilicon portion on a portion of the second layer of dielectric material having a second width, wherein the second width is less than the first width.

9. The method of claim 8, wherein the step of forming a second portion of the first gate structure includes nonphotolithographically forming the second width of the second portion of the first gate structure.

10. The method of claim 1, further including the step of forming a first conductive strap to electrically couple the first portion of the first gate structure to the second portion of the first gate structure.

11. The method of claim 1, further including forming the first dopant layer to be of a second conductivity type, doping the portion of the semiconductor material adjacent the second side of the first portion of the first gate structure and the portion of the semiconductor material adjacent the second side of the second portion of the first gate structure with impurity materials of the second conductivity type, and doping the first gate structure with impurity materials of the second conductivity type.

12. The method of claim 1, further including the steps of:
forming a dopant well of a second conductivity type in a portion of the semiconductor material;
forming a second dopant layer extending from the major surface into the dopant well;
forming a first portion of a second gate structure on a second portion of a first layer of dielectric material, the first portion of the second gate structure having first and second sides and spaced apart from the major surface by the second portion of the first layer of dielectric material;
doping at least one portion of the dopant well adjacent the first side of the first portion of the second gate structure with impurities of the second conductivity type;
laterally removing a subportion of the second portion of the first layer of dielectric material to form a second cavity, the second cavity extending between the first portion of the second gate structure and the major surface from the first side;
forming a third layer of dielectric material adjacent at least the first portion of the second gate structure;
forming a second portion of the second gate structure, the second portion of the second gate structure spaced apart from the first side of the second gate structure by the third layer of dielectric material filling a portion of the second cavity;
doping a portion of the dopant well adjacent the second side of the first portion of the second gate structure and a portion of the dopant well adjacent the second side of the second portion of the second gate structure; and
doping a portion of the second gate structure.

13. The method of claim 12, further including forming the second dopant layer to be of the first conductivity type, doping the portion of the semiconductor material adjacent the second side of the first portion of the second gate structure and the portion of the semiconductor material adjacent the second side of the second portion of the second gate structure with impurity materials of the first conductivity type, and doping the second gate structure with impurity materials of the first conductivity type.

14. The method of claim 12, wherein the step of forming a first portion of a second gate structure includes forming a third polysilicon portion on the first layer of dielectric material having a third width and the step of forming the second portion of a second gate structure includes forming a fourth polysilicon portion on a portion of second layer of dielectric material having a fourth width, wherein the fourth width is less than the third width.

15. The method of claim 12 further including the step of forming a second conductive strap to electrically couple the portion of the second gate structure to the second portion of the second gate structure.

16. A method of forming an insulated gate semiconductor device, comprising the steps of:
providing a semiconductor material of a first conductivity type and having a major surface;
forming a first dopant layer of a second conductivity type extending from the major surface into the semiconductor material;
forming a first layer of dielectric material on the major surface;
forming a first portion of a first gate structure on a first portion of the first layer of dielectric material, the first portion of the first gate structure having first and second sides and a top surface;
forming a first cavity extending under the first portion of the first gate structure from the first side and exposing a portion of the major surface;
forming at least one enhanced dopant region of the first conductivity type in the semiconductor material, the at least one enhanced dopant region aligned to the first side of the first portion of the first gate structure;
forming a second layer of dielectric material on the first gate structure and the portion of the major surface that is exposed;
forming a second portion of the first gate structure on the second layer of dielectric material, the second portion of the first gate structure having first and second sides, the second side of the second portion of the first gate structure being adjacent the first side of the first portion of the first gate structure;
forming first and second dopant regions of the second conductivity type, the first dopant region aligned to the first side of the second portion of the first gate structure and the second dopant region aligned to the second side of the first portion of the first gate structure;
doping the first and second portions of the first gate structure with impurities of the second conductivity type; and
forming a first conductive strap which couples the first and second portions of the first gate structure.

17. The method of claim 16, wherein the step of forming at least one enhanced dopant region of the first conductivity type in the semiconductor material further includes forming a screen oxide on the first gate structure and on the portion of the major surface that is exposed, implanting impurities of the first conductivity type into the semiconductor material, and removing the screen oxide.

18. The method of claim 16, wherein the step of forming a second portion of the first gate structure includes depositing one of a semiconductor material or a conductor material on the second layer of dielectric material, wherein the one of a semiconductor material or a conductor material fills a portion of the first cavity.

19. The method of claim 18, wherein the one of a semiconductor material or a conductor material is selected from a group consisting of polysilicon, amorphous silicon, single crystal silicon, and tungsten.

20. The method of claim 16, wherein the step of forming first and second dopant regions of the second conductivity type, and the step of doping the first and second portions of the first gate structure with impurities of the second conductivity type are performed simultaneously.

21. The method of claim 16, wherein the step of forming a first layer of dielectric material on the major surface includes forming the first layer of dielectric material having a thickness of at least 400 angstroms.

22. The method of claim 16, further including the steps of:

forming a dopant well of the second conductivity type in a portion of the semiconductor material;

forming a second dopant layer of the first conductivity type extending from the major surface into the dopant well;

forming a first layer of dielectric material on the major surface;

forming a first portion of a second gate structure on a first portion of the first layer of dielectric material, the first portion of the second gate structure having first and second sides and a top surface;

forming a first cavity extending under the first portion of the second gate structure from the first side and exposing a portion of the major surface;

forming at least one enhanced dopant region of the second conductivity type in the dopant well, the at least one enhanced dopant region aligned to the first side of the first portion of the second gate structure;

forming a second layer of dielectric material on the second gate structure and the portion of the major surface that is exposed;

forming a second portion of the second gate structure on the second layer of dielectric material, the second portion of the second gate structure having first and second sides, the second side of the second portion of the second gate structure being adjacent the first side of the first portion of the second gate structure;

forming third and fourth dopant regions of the first conductivity type, the third dopant region aligned to the first side of the second portion of the second gate structure and the fourth dopant region aligned to the second side of the first portion of the second gate structure;

doping the first and second portions of the second gate structure with impurities of the first conductivity type; and forming a second conductive strap which couples the first and second portions of the second gate structure.

23. The method of claim 22, wherein the step of forming the first conductive strap and the step of forming the second conductive strap includes forming the first and second conductive straps from a silicide.

* * * * *